(12) United States Patent
Geinitz et al.

(10) Patent No.: US 9,281,270 B2
(45) Date of Patent: Mar. 8, 2016

(54) METHOD FOR MAKING CONTACT WITH A SEMICONDUCTOR AND CONTACT ARRANGEMENT FOR A SEMICONDUCTOR

(71) Applicant: Robert Bosch GmbH, Stuttgart (DE)

(72) Inventors: Eckart Geinitz, Pfullingen (DE); Gerhard Braun, Rottenburg (DE); Erik Sueske, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/359,630

(22) PCT Filed: Nov. 20, 2012

(86) PCT No.: PCT/EP2012/073074
§ 371 (c)(1),
(2) Date: May 21, 2014

(87) PCT Pub. No.: WO2013/076064
PCT Pub. Date: May 30, 2013

(65) Prior Publication Data
US 2014/0299998 A1 Oct. 9, 2014

(30) Foreign Application Priority Data

Nov. 21, 2011 (DE) .......................... 10 2011 086 687

(51) Int. Cl.
*H01L 23/00* (2006.01)
*H01L 23/498* (2006.01)
(Continued)

(52) U.S. Cl.
CPC ........ *H01L 23/49838* (2013.01); *H01L 21/768* (2013.01); *H01L 24/27* (2013.01); *H01L 24/32* (2013.01); *H01L 24/33* (2013.01); *H01L 24/36* (2013.01); *H01L 24/37* (2013.01); *H01L 24/40* (2013.01); *H01L 23/49513* (2013.01); *H01L 23/49524* (2013.01); *H01L 24/29* (2013.01); *H01L 2224/26145* (2013.01); *H01L 2224/27013* (2013.01); *H01L 2224/29101* (2013.01);
(Continued)

(58) Field of Classification Search
None
See application file for complete search history.

(56) References Cited

U.S. PATENT DOCUMENTS

| 4,935,803 A | 6/1990 | Kalfus et al. |
| 2006/0137040 A1 | 6/2006 | Debonte et al. |

(Continued)

FOREIGN PATENT DOCUMENTS

| DE | 10332695 | 2/2005 |
| DE | 102009014582 | 10/2009 |

(Continued)

OTHER PUBLICATIONS

International Search Report for Application No. PCT/EP2012/073074 dated Feb. 25, 2013 (English Translation, 3 pages).

*Primary Examiner* — Yasser A Abdelaziez
(74) *Attorney, Agent, or Firm* — Michael Best & Friedrich LLP

(57) ABSTRACT

The invention relates to a method for making contact with a semiconductor (10), and to a contact arrangement (1) for a semiconductor (10), wherein the semiconductor (10) is a really connected to a first contact partner (20) at at least one first area by the formation of a first soldering layer (30) having a predefined thickness. According to the invention, a polyimide layer (14) is applied as delimiting means on the semiconductor (10), said polyimide layer predefining the dimensions and/or the form of at least one soldering area (12) of the semiconductor (10).

11 Claims, 3 Drawing Sheets

(51) Int. Cl.
*H01L 21/768* (2006.01)
*H01L 23/495* (2006.01)

(52) U.S. Cl.
CPC .............. *H01L2224/32225* (2013.01); *H01L 2224/32245* (2013.01); *H01L 2224/33181* (2013.01); *H01L 2224/352* (2013.01); *H01L 2224/371* (2013.01); *H01L 2224/37012* (2013.01); *H01L 2224/40245* (2013.01); *H01L 2224/49171* (2013.01); *H01L 2924/1305* (2013.01); *H01L 2924/1306* (2013.01); *H01L 2924/13055* (2013.01); *H01L 2924/13091* (2013.01)

(56) References Cited

U.S. PATENT DOCUMENTS

| | | |
|---|---|---|
| 2006/0205112 A1 | 9/2006 | Standing et al. |
| 2006/0240598 A1 | 10/2006 | Standing et al. |
| 2009/0246910 A1* | 10/2009 | Taniguchi et al. ............ 438/107 |
| 2011/0283034 A1* | 11/2011 | Kang et al. ................... 710/305 |

FOREIGN PATENT DOCUMENTS

| | | |
|---|---|---|
| EP | 0358077 | 3/1990 |
| EP | 2093793 | 8/2009 |

\* cited by examiner

METHOD FOR MAKING CONTACT WITH A SEMICONDUCTOR AND CONTACT ARRANGEMENT FOR A SEMICONDUCTOR

BACKGROUND OF THE INVENTION

The invention relates to a method for making contact with a semiconductor and also to a contact arrangement for a semiconductor.

In the case of so-called high power applications, in which high power outputs are switched, devices for producing a contact arrangement are soldered generally as components without a housing, so-called "bare-dies" onto substrates, such as for example direct bonded copper (DBC), insulated metal substrate (IMS) etc., and/or onto circuit boards and/or onto lead frames or the like. The semiconductors are surface-connected to at least one first contact partner on at least one first surface by means of providing a first solder layer that has a predetermined thickness. One problem in this case resides in the fact that the semiconductor that is not laterally guided can float out of position on the solder layer so that the semiconductor does not retain the original position but rather moves sideward on the substrate. This lateral movement can be prevented by means of suitable measures. These measures differ from contact partner to contact partner.

In addition, the semiconductor in the case of the above mentioned high-power applications is not only soldered on the contact face that is facing the first contact partner but rather said semiconductor also makes contact with a second contact partner by means of providing a second solder layer with a second contact surface. Contact with the first contact surface is generally made by way of a metal clip and/or a metal bridge but in some cases also by way of a suitable DBC. The underside is generally an insulated metal block for the purpose of storing or distributing heat, however said underside can also be a different substrate.

The unexamined German application DE 103 32 695 A1 describes, by way of example, an arrangement for fastening a device to at least one substrate. In the case of the described arrangement, a solder layer is provided on a solder site of the device, wherein the solder site is arranged on the upper surface that faces the respective substrate. Furthermore, at least one recess is provided in the respective substrate for the purpose of receiving any excess solder and/or for the purpose of restricting the solder to the upper surface of the carrier. The substrate upper surface that has the recess faces the solder site of the device.

The printed patent specification U.S. Pat. No. 4,935,803 describes a contact arrangement for a component. In the described contact arrangement, the component is surface-connected to at least one first contact partner on at least one first surface by means of providing a first solder layer, wherein the first contact partner is embodied as an electrical contact bracket. Furthermore, the component is surface-connected to a second contact partner on a second surface by means of providing at least one second solder layer. A convex bracket shape prevents the first solder layer from running off course and provides a self-centering arrangement for the bracket of the component.

SUMMARY OF THE INVENTION

In contrast, the method in accordance with the invention for making contact with a semiconductor and accordingly the contact arrangement in accordance with the invention for a semiconductor have the advantage that a solder-resistant layer is applied as a restricting means to the semiconductor and said solder-resistant layer determines the dimensions and/or the shape of at least one solder area of the semiconductor and prevents said semiconductor from floating out of position and/or from displacing sideward during the soldering process. Materials, such as for example polyimides, that prevent the layer being wetted with solder are suitable for providing a solder-resistant layer. Polyimides are high performance synthetic materials whose most important structural feature is the imide group. In an advantageous manner, pure aromatic polyimides generally cannot melt and are chemically extremely resistant even with respect to many solvents. As a result of their ability to resist heat, the fact that they release very little gas, their resistance to radiation, their insulating properties and the characteristic that conventional solvents do not adhere to a polyimide layer, polyimide solutions are extremely suitable as coating agents for defining a solder area on the semiconductor.

In an advantageous manner, embodiments of the present invention prevent the semiconductor from floating sideward out of position and/or from rotating during the soldering process and provide advantages in contrast to other known solutions particularly in the case where solder is applied to two sides of the semiconductor. In an advantageous manner, the solder-resistant layer protects those areas of the semiconductor that are not to come into contact with the soldering agent and ensures that the solder area is created in a simple and rapid manner by means of providing recesses in the solder-resistant layer. In an advantageous manner, it is only necessary for the semiconductor that is to be attached to be prepared and to be pretreated with the solder-resistant layer, whereas it is not necessary to provide the contact partner with additional restrictive features and/or protective measures to prevent the semiconductor from floating out of position. It is preferred that the solder-resistant coating is an existing element of the semiconductor housing.

The essential idea of the present invention resides in the fact that the applied soldering agent can be retained within a defined solder area on the semiconductor by means of the solder-resistant layer.

Embodiments of the method in accordance with the invention for making contact with a semiconductor surface-connect a semiconductor to at least one first contact partner on at least one first surface by means of providing a first solder layer that has a predetermined thickness. In accordance with the invention, a solder-resistant layer by way of example a polyimide layer is applied as a restricting means to the semiconductor and said solder-resistant layer predetermines the dimensions and/or the shape of at least one solder area of the semiconductor.

The invention furthermore provides a contact arrangement for a semiconductor that is surface-connected to a first contact partner on at least one first surface by means of providing a first solder layer that has a predetermined thickness. In accordance with the invention, a solder-resistant layer by way of example a polyimide layer is applied as a restricting means to the semiconductor and said solder-resistant layer predetermines the dimensions and/or the shape of at least one solder area of the semiconductor.

Embodiments of the invention surface-connect a semiconductor in an advantageous manner to a first contact surface of a first contact partner so that it is possible to achieve less electrical resistance in the case of a homogenous current distribution and a high power density on the semiconductor.

It is possible by means of the features and further developments disclosed in the dependent claims to achieve advantageous improvements of the method in accordance with the invention that is for making contact with a semiconductor and to achieve advantageous improvements of the contact arrangement in accordance with the invention that is for making contact with a semiconductor.

It is particularly advantageous that the lateral spacing between at least one contact surface of the at least first contact partner and the border of the solder-resistant layer is selected in dependence upon the thickness of the solder layer. A maximum tolerance range over which the semiconductor can float out of position can be predetermined by means of the spacing. This is particularly advantageous if excess soldering agent is applied during the soldering process.

In an advantageous embodiment of the method in accordance with the invention for making contact with a semiconductor, the borders of the at least one contact surface of the first contact partner can be rounded. The rounded shape of the borders can be achieved preferably by means of embossing that side of the first contact partner that is opposite the contact surface. The rounded shape of the at least one first contact surface advantageously avoids mechanical contact between an edge of the semiconductor and the first contact partner even in the event of the semiconductor and the first contact partner tilting greatly. As a consequence, the critical active structures in the border region can thus be protected in an advantageous manner. Furthermore, it is possible by means of providing a corresponding shaping to tailor the at least one contact surface of the first contact partner that is to be contacted to suit the at least one solder area of the semiconductor and in the ideal case for said contact surface to correspond to the at least one solder area of the semiconductor. As a consequence, adhesive forces produced by the soldering agent during the soldering process can prevent the semiconductor from rotating or floating out of position. This arrangement represents a cost-effective solution since in an advantageous manner it is not necessary to provide additional features such as for example a solder resist layer or dimples. Furthermore, the contact surface of the at least one first contact partner can be embodied so that the soldering agent flows on the semiconductor as far as the restricting solder-resistant layer and on the contact surface of the first contact partner as far as the edges of the contact surface. As a consequence, it is possible in an advantageous manner to use the entire contact surface that is available for contacting purposes, so that clear advantages can be achieved with respect to current distribution, the electrical resistance and the heat dissipation. In addition, the mechanical stresses at the edges of the semiconductor can be reduced in an advantageous manner and thus damage to the semiconductor can be avoided.

In a further advantageous embodiment of the method in accordance with the invention for making contact with a semiconductor, the semiconductor can be surface-connected to a second contact partner on a second surface by means of providing at least one second solder layer. This renders it possible in an advantageous manner for semiconductors that are to be contacted to be fastened to substrates, such as for example direct bonded copper (DBC), IMS (insulated metal structure) etc. and/or circuit boards and/or lead frames and/or heat dissipating elements.

It is particularly advantageous that the spacing between the at least one contact surface of the at least first contact partner and the border of the solder-resistant layer corresponds to two-times to four-times the thickness of the solder layer. It is preferred that the thickness of the solder layer amounts to approx. 50 to 100 μm and the corresponding lateral spacing is then preferably in the range from 100 to 400 μm.

In an advantageous embodiment of the contact arrangement in accordance with the invention for a semiconductor, the semiconductor is surface-connected to a second contact partner on a second surface by means of providing a second solder layer. The first contact partner can be embodied by way of example as a bracket and/or a metal clip and/or as a bridge, wherein the semiconductor is connected in an electrical manner to at least one component by way of the first contact partner. The second contact partner can be embodied by way of example as a substrate and/or as a circuit board and/or as a lead frame and/or as a heat dissipating element. By virtue of making contact with the first contact partner that is embodied as a bracket and/or bridge, the semiconductor can be connected to the other components in advantageous manner for the purpose of transmitting high power outputs with a low transitional resistance. Thus, the semiconductor can be connected by way of example to a current source and/or a voltage source and/or a different semiconductor component. Simultaneously, the semiconductor can be connected to different second contact partners, as a consequence of which it is possible in an advantageous manner to select the material to suit the situation. Thus, materials can be selected by way of example that can have insulating and/or cooling and/or heat-storing and/or heat-dissipating characteristics. By virtue of embodiments of the contact arrangement in accordance with the invention, semiconductors can be combined in an advantageous manner with first contact partners that have good electrical conductivity properties, and with second contact partners that render it possible to achieve good thermal dissipation. In an advantageous manner, this increases the serviceable life and/or the reliability of the semiconductor.

In a further advantageous embodiment of the contact arrangement in accordance with the invention for a semiconductor, the second solder layer extends with the second contact partner essentially parallel to the first solder layer with the first contact partner. This renders it possible in an advantageous manner to produce a sandwich-like structure in which the semiconductor is arranged between the first contact partner, which is embodied by way of example as a bracket, and the second contact partner, which is embodied by way of example as a substrate. By virtue of exploiting the adhesive forces, the semiconductor can be connected and fastened at the designated position without tilting and/or floating out of position.

In a further advantageous embodiment of the contact arrangement in accordance with the invention for a semiconductor, the first contact partner can comprise a continuous contact surface or multiple contact surfaces. In this manner, it is possible in an advantageous manner to use additional edges on the semiconductor that ensure that the semiconductor rotates and/or floats out of position even less during the soldering process.

So-called gate fingers are generally provided on large semiconductors. Said gate fingers are metal strips that extend from a gate over an emitter surface but are insulated from said emitter surface. The gate fingers are used for the purpose of providing a gate signal to the cells more quickly than would be possible by way of the semiconductor structure. It is preferred that the gate fingers and the semiconductor border are insulated in an upwards direction by means of a solder-resistant layer, such as for example a polyimide layer. The upper semiconductor surface can be segmented in additional solder areas by means of the gate fingers and said solder areas can be used as additional protection to prevent the semiconductor from floating out of position. For this purpose, the segmented areas are subsequently produced by means of slots in the bracket at such sites in the surface that additional individual solder areas are produced during the process of wetting with solder. As a consequence, the length of the border that the solder can attack can be increased, and the risk of the semiconductor floating out of position during the soldering process can be further reduced. A metal clip can be used in order to make contact with a power component in this manner and said metal clip covers the complete surface of the semiconductor by means of an embossed structure. Simultaneously, the embossed area of the boundary structures of the metal clip prevents a mechanical load being exerted on the edges of the semiconductor.

As an alternative, additional strips made from a solder-resistant material, by way of example polyimide strips, are embodied on the semiconductor and said additional strips segment the upper semiconductor surface into additional solder areas corresponding to the above described gate fingers but do not have an electrical function. These polyimide strips provide protection in an advantageous manner to prevent the semiconductor rotating and/or floating out of position during the soldering process.

The solder-resistant layer can generally be embodied on the one hand in such a manner that it completely encircles at least one solder area of the semiconductor, wherein by way of example a rectangular or circular solder area is formed. In this manner, as the contact surface of a first contact partner is tailored to suit the shape and size of the encircled solder area of the semiconductor, the semiconductor is prevented as a result of the adhesive forces from floating out of position in any direction starting from the border. For the same reason, the semiconductor is likewise no longer able to rotate.

In one embodiment of the invention, the solder-resistant layer represents only one part of a border at least of one solder area of the semiconductor. By way of example, the solder-resistant layer is embodied in the form of two parallel strip sections that are spaced apart from one another, wherein the at least one solder area is provided between the two strip sections. The solder-resistant layer represents a restricting means at least in the region where it adjoins the solder area and in this manner determines the dimensions and/or the shape of the at least one solder area. In this manner, as the contact surface of a first contact partner is tailored to suit the shape and size of the designated solder area of the semiconductor, the semiconductor is prevented as a result of the adhesive forces from floating out of position at least in the direction of the border of the solder-resistant layer with respect to the solder area. Generally, the semiconductor is likewise not able to rotate.

Exemplary embodiments of the invention are illustrated in the drawings and are described in detail in the description hereinunder. Like reference numerals are used in the drawing to describe components and/or elements that perform like and/or similar functions.

DETAILED DESCRIPTION

Figure 1:
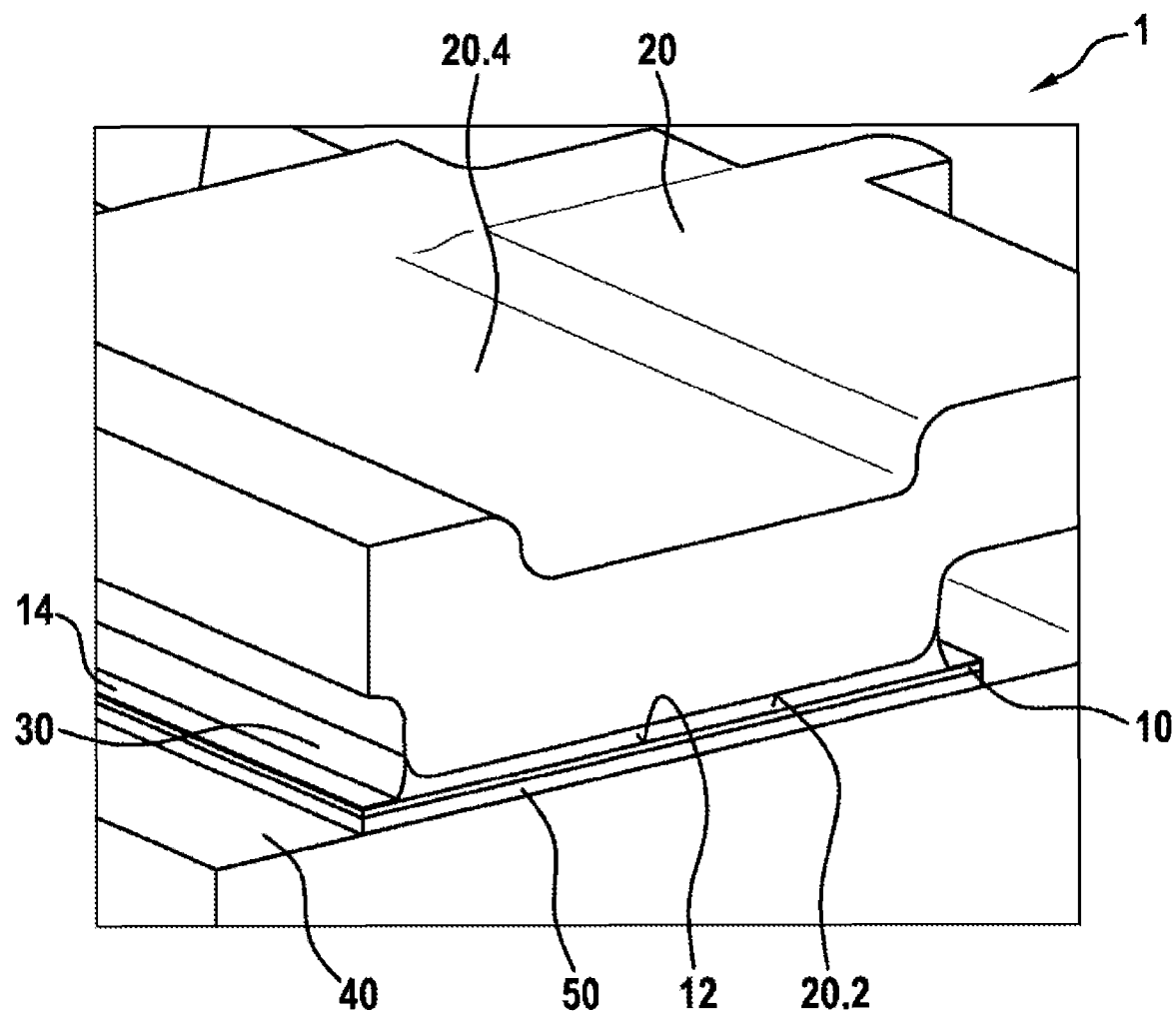
FIG. 1 illustrates a schematic perspective view of a first exemplary embodiment of a contact arrangement in accordance with the invention.

As is evident in FIGS. 1 to 4, the illustrated exemplary embodiments of a contact arrangement 1, 1', 1" comprise a semiconductor 10, 10', 10" that is surface-connected to at least one first contact partner 20, 20', 20", 60" on at least one first surface by means of providing a first solder layer 30, 32', 34', 36', 30" that has a predefined thickness LD.

In accordance with the invention, a polyimide layer 14, 14', 14" is provided as a restricting means on the semiconductor 10, 10', 10" and said polyimide layer predetermines the dimensions and/or the shape of at least one solder area 12, 12', 12" of the semiconductor 10, 10', 10". The first solder layer 30, 32', 34', 36', 30", 80" is retained in an advantageous manner within the predefined region of the solder area 12, 12', 12" on the semiconductor 10, 10', 10" by means of the polyimide layer 14, 14', 14", 18'.

The illustrated exemplary embodiments are suitable for high power applications, in particular for such applications where it is necessary to switch high power outputs, and semiconductor switches, such as for example Power-MOSFETs (power metal oxide semiconductor field effect transistors) and/or IGBT (bipolar transistors having insulated gate electrodes).

Figure 2:
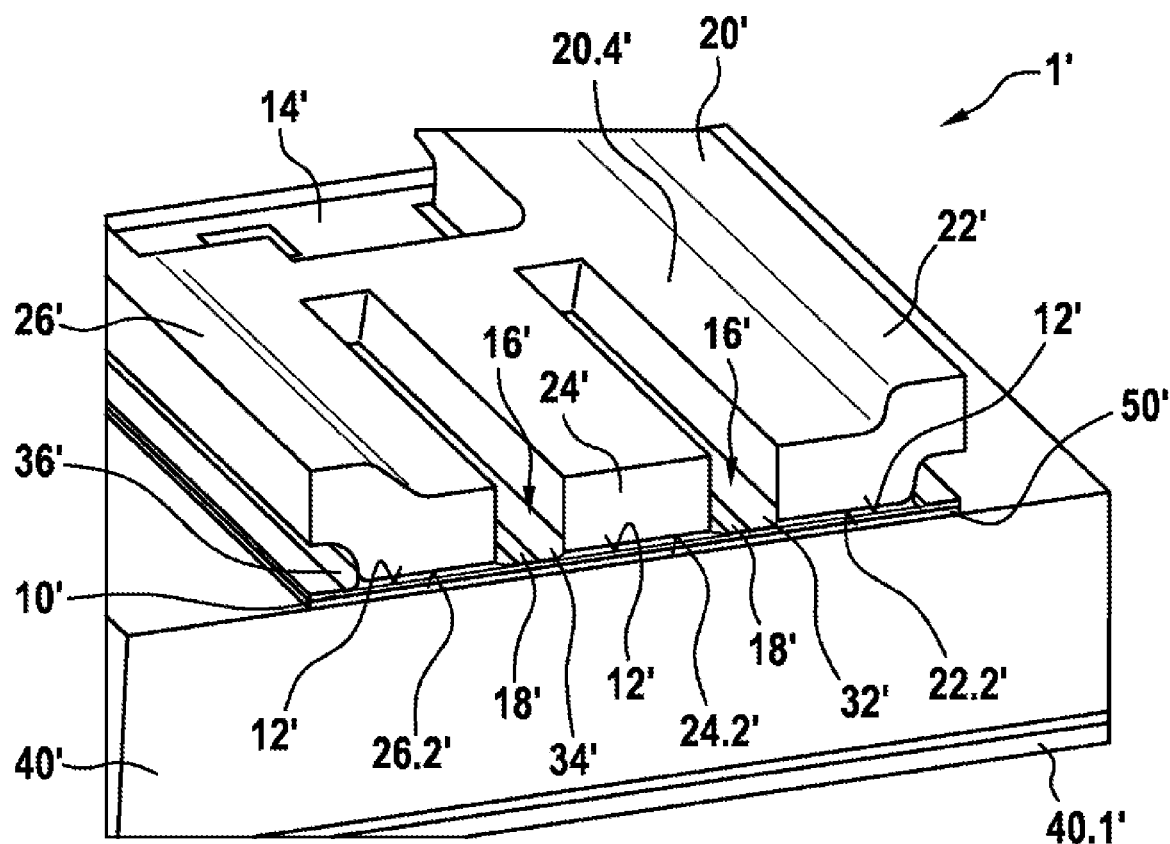
FIG. 2 illustrates a schematic perspective view of a second exemplary embodiment of a contact arrangement in accordance with the invention.
Figure 4:
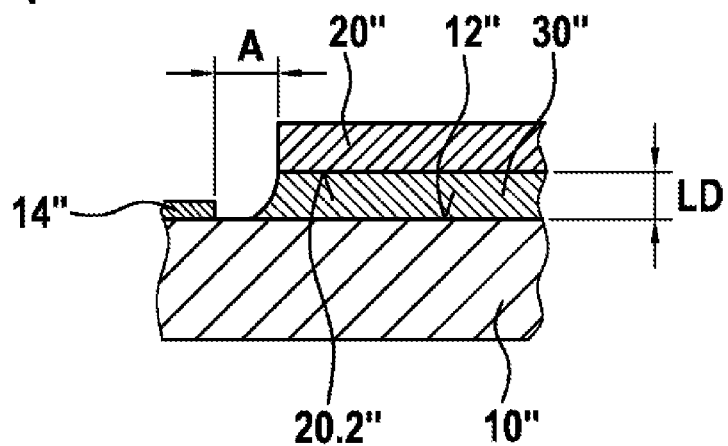
FIG. 4 illustrates an enlarged sectional view that illustrates the lateral spacing between the contact surface of the first contact element and the polyimide layer of the schematic sectional view in FIG. 3.

As is further evident in FIGS. 1 and 2, the polyimide layer 14, 14', 18' encircles the at least one solder area 12, 12' on the semiconductor, wherein a lateral spacing A that is described in detail hereinunder with reference to FIG. 4 is defined as the shortest spacing between an inner edge of the polyimide layer 14, 14', 18' and an outer edge of the contact surface 20.2, 22.2', 24.2' 26.2' of the first contact partner 20, 20'. Polyimide is particularly suitable as a restricting means since this material can withstand high temperatures and in particular can be easily applied in the form of a thin film. Furthermore, conventional soldering agents do not adhere to polyimide.

As is further evident in FIGS. 1 to 4, the semiconductor 10, 10', 10" in the illustrated exemplary embodiment is surface-connected to a second contact partner 40, 40' 40" on a second surface by means of providing a second solder layer 50, 50', 50". The first contact partner 20, 20', 20" and/or a third contact partner 60" is embodied as a metal bracket or as a metal clip or as a metal bridge. The first and/or the third contact partner 20, 20', 20" connect the semiconductor 10, 10', 10" in an electrical manner to at least one further component 70", 90", wherein the first and/or the third contact partner 20, 20' are connected in each case by way of a solder layer 72", 92" to the components 70", 90" as is evident in FIG. 3. The second contact partner 40, 40', 40" is embodied as a substrate and/or as a circuit board and/or as a lead frame and/or as a heat dissipating element. Furthermore, the second solder layer 50, 50', 50" with the second contact partner 40, 40', 40" extends essentially parallel to the first solder layer 30, 32', 34', 36', 30" with the first contact partner 20, 20', 20", 60".

As is further evident in FIG. 2, the second contact partner 40' in the illustrated exemplary embodiment comprises in addition an insulating layer 40.1' and is embodied as an insulated metal block for the purpose of storing or distributing heat.

As is further evident from FIG. 1, the first contact partner 20 comprises a continuous contact surface 20.2, wherein the borders of the at least one contact surface 20.2 of the first contact partner 20 are rounded. The rounded shape of the borders can be achieved in particular by means of introducing an embossed area 20.4 on one side of the first contact partner 20 that lies opposite the contact surface 20.2. In this manner, the contact surface 20.2 can be tailored in a simple and rapid manner to suit the dimension of the solder area 12 of the semiconductor 10, in that the embossed area 20.4 corresponds in shape and size to the solder area 12 of the semiconductor. By virtue of the shape of the contact surface 20.2 and by exploiting the adhesive forces that occur, it is possible in an advantageous manner to prevent the semiconductor 10 from floating and/or sliding out of position during a soldering process, in particular during a double-sided soldering process. By virtue of the shape of the bracket support and the adhesive forces of the solder layer 30, it is no longer possible for the semiconductor 10 to rotate or float out of position during the soldering process. As is further evident in FIG. 1, the first contact partner 20 that is embodied as a bracket is embodied in such a manner that the solder is distributed on the semiconductor 10 in such a manner that said solder flows as far as the restricting polyimide layer 14 to which the solder does not adhere. At the first contact partner 20 that is embodied on the bracket the solder flows as far as the edges of the bracket support.

As is further evident in FIG. 2, the first contact partner 20' comprises multiple contact surfaces 22.2', 24.2', 26.2'. In the illustrated embodiment, the semiconductor 10' comprises multiple solder areas 12' that are separated by so-called gate fingers 16'. Said gate fingers are metal strips that extend from a gate over an emitter surface but are insulated from said emitter surface. The gate fingers 16' provide a gate signal to the cells more quickly than would be possible by way of the semiconductor structure. These gate fingers 16' are generally insulated in an upward direction by means of a polyimide covering 18' or rather a polyimide layer. The first contact partner 20' comprises corresponding conductor structures 22', 24', 26' having multiple contact surfaces 22.2', 24.2', 26.2' in order to make contact with those solder areas 12' of the semiconductor 10' that are separated by the gate fingers 16'. A first contact surface 26.2' can be tailored by means of polishing and/or etching and/or bending to suit a first conductor structure 26' that corresponds to the emitter surface. Furthermore, the edge of the first conductor structure 26' is not rounded on both sides. A second conductor structure 24' has the shape of a building block wherein the edges of the contact surface 22.4' are not rounded. A third conductor structure 22' comprises two rounded edges that are formed by means of an embossed area 20.4' on a side that lies opposite the contact surface 22.2'. The described conductor structures 22', 24', 26' are possible exemplary embodiments, wherein also other shapes and manufacturing methods are possible for the separate conductor structures 22', 24', 26'. Likewise, the contact surfaces 20.2', 22.4', 22.6 can be varied. Furthermore, more or fewer gate fingers 16' and correspondingly more or fewer corresponding conductor structures 22', 24', 26' can be formed.

In the case of an alternative embodiment (not illustrated) of the present invention, additional polyimide strips are embodied on the semiconductor 10' and according to the above described gate fingers 16' segment the upper semiconductor surface into additional solder areas but do not have an electrical function.

The additional edges on the semiconductor 10' render it possible in an advantageous manner to provide improved protection to prevent the semiconductor rotating and/or floating out of position during the soldering process. For this purpose, the first surface of the semiconductor 10' is segmented into additional solder areas 12'. For this purpose, the segmented areas 12' are subsequently produced by means of slots in the metal bracket at such sites on the semiconductor 10' that individual solder areas 12' are produced during the process of wetting with solder. As a consequence, the length of the border that the solder can attack can be increased and the risk of the semiconductor 10' floating out of position during the soldering process can be further reduced.

Figure 3:
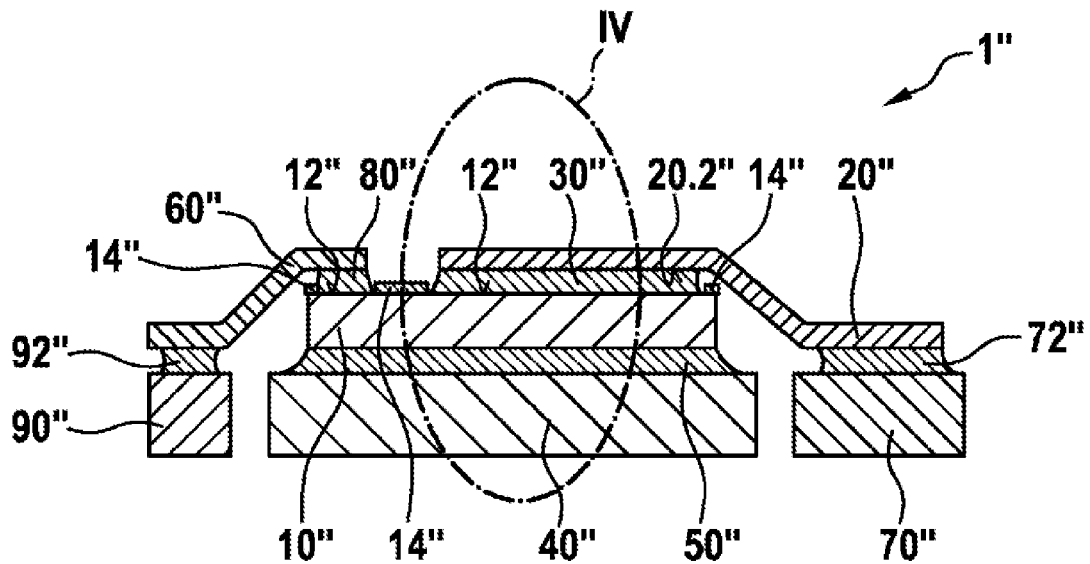
FIG. 3 illustrates a schematic cross-sectional view of a third exemplary embodiment of a contact arrangement in accordance with the invention.

As is evident in FIG. 3, in the illustrated exemplary embodiment, the first surface of the semiconductor 10" is likewise segmented by means of polyimide layers 14", wherein the solder areas 12" that arise in this manner are surface-connected to at least two contact partners 20", 60" by means of solder layers 30", 80" that have a predetermined thickness LD. In the illustrated exemplary embodiment, the semiconductor 10" is connected to a first component 70" by way of the first contact parent 20" and by way of a fourth solder layer 72" and connected to a second component by way of the third contact partner 60" and a fifth solder layer 92". Thus, the semiconductor 10" can be connected by way of the first and/or third contact partner 20", 60" by way of example to a current source and/or voltage source and/or a different semiconductor component.

As is further evident in FIG. 4, the polyimide layer 14" is applied in such a manner that the lateral spacing A between the at least one contact surface 20.2" of the at least one first contact partner 20" and the border of the polyimide layer 14" corresponds to twice up to four times the solder layer thickness LD. In the illustrated exemplary embodiment illustrated in FIG. 4, the thickness LD of the solder layer 30" is by way of example approx. 50 to 100 μm and the lateral spacing A is then preferably in the range of 100 to 400 μm.

In the case of the corresponding method for making contact with a semiconductor 10, 10', 10", the semiconductor 10, 10', 10" is surface-connected to at least one first contact partner 20, 20' 20", 60" on at least one first surface by means of providing a first solder layer 30, 32', 34', 36', 30", 80" that has a predetermined thickness LD. In accordance with the invention, a polyimide layer 14, 14', 14", 18' is provided as a restricting means on the semiconductor 10, 10', 10" and said polyimide layer predetermines the dimensions and/or the shape of at least one solder area 12, 12', 12" of the semiconductor 10, 10', 10". The lateral spacing A between at least one contact surface 20.2, 22.2', 24.2', 26.2', 20.2" of the at least first contact partner 20, 20', 20", 60" and the border of the polyimide layer 14, 14, 14", 18' is selected in dependence upon the thickness LD of the solder layer 30, 32', 34', 36', 30", 80". The borders of the at least one contact surface 20.2, 22.2', 24.2', 26.2', 20.2" of the first contact partner 20, 20', 20", 60" are rounded, wherein the rounded shape of the borders is achieved in particular by means of introducing an embossed area 20.4, 20.4' on a side of the first contact partner 20, 20', 20", 60" that lies opposite the contact surface 20.2, 22.2', 24.2', 26.2', 20.2". Furthermore, the semiconductor 10, 10', 10" is surface-connected to a second contact partner 40, 40', 40" on a second surface by means of providing at least one second solder layer 50, 50', 50".

The invention claimed is:

1. A method for making contact with a semiconductor, wherein the semiconductor (10, 10', 10") is surface-connected to at least one first contact partner (20, 20', 20", 60") on at least one first surface by providing a first solder layer (30, 32', 34', 36', 30", 80") that has a predetermined thickness (LD), characterized in that a solder-resistant layer of polyimide (14, 14', 14", 18') is provided as a restricting means on the semiconductor (10, 10', 10") and said solder-resistant polyimide layer determines at least one of the dimensions and the shape of at least one solder area (12, 12', 12") of the semiconductor (10, 10', 10") and prevents the semiconductor (10, 10', 10") from floating and displacing laterally during the soldering process, and in that a lateral spacing (A) between at least one contact surface (20.2, 22.2', 24.2', 26.2', 20.2") of the at least one first contact partner (20, 20', 20", 60") and a border of the solder-resistant polyimide layer (14, 14', 14", 18') is selected in dependence upon the thickness (LD) of the first solder layer (30, 32', 34', 36', 30", 80").

2. The method as claimed in claim 1, characterized in that borders of the at least one contact surface (20.2, 22.2', 24.2', 26.2', 20.2") of the first contact partner (20, 20', 20", 60") are rounded.

3. The method as claimed in claim 1, characterized in that the semiconductor (10, 10', 10") is surface-connected to a second contact partner (40, 40', 40") on a second surface by providing at least one second solder layer (50, 50', 50").

4. A contact arrangement for a semiconductor, wherein the semiconductor (10, 10', 10") is surface-connected to at least one first contact partner (20, 20', 20", 60") on at least one first surface by providing a first solder layer (30, 32', 34', 36', 30") that has a predetermined thickness (LD), characterized in that a solder-resistant layer of polyimide (14, 14', 14", 18') is provided as a restricting means on the semiconductor (10, 10', 10") and said solder-resistant polyimide layer determines at least one of the dimensions and the shape of at least one solder area (12, 12', 12") of the semiconductor (10, 10', 10") and prevents the semiconductor (10, 10', 10") from floating and displacing laterally during the soldering process, and in that the solder-resistant polyimide layer (14, 14', 14", 18') is provided in such a manner that a lateral spacing (A) between at least one contact surface (20.2, 22.2', 24.2', 26.2', 20.2") of the at least one first contact partner (20, 20', 20", 60") and a border of the solder-resistant polyimide layer (14, 14', 14", 18') corresponds to between two and four times the solder layer thickness (LD).

5. The contact arrangement as claimed in claim 4, characterized in that the semiconductor (10, 10', 10") is surface-connected to a second contact partner (40, 40', 40") on a second surface by providing a second solder layer (50, 50', 50").

6. The contact arrangement as claimed in claim 4, characterized in that the first contact partner (20, 20', 20", 60") is embodied as at least one of a bracket, a metal clip and a bridge, wherein the semiconductor (10, 10', 10") is connected in an electric manner to at least one component (70", 90") by way of the first contact partner (20, 20', 20", 60"), and wherein the second contact partner (40, 40', 40") is embodied as at least one of a substrate, a circuit board, a lead frame and a heat dissipating element.

7. The contact arrangement as claimed in claim 4, characterized in that the first contact partner (20, 20', 20", 60") comprises a continuous contact surface (20.2, 20.2").

8. The contact arrangement as claimed in claim 4, characterized in that the first contact partner (20, 20', 20", 60") comprises multiple contact surfaces (22.2', 22.4', 22.6').

9. The method as claimed in claim 1, characterized in that borders of the at least one contact surface (20.2, 22.2', 24.2', 26.2', 20.2") of the first contact partner (20, 20', 20", 60") are rounded, wherein a rounded shape of the borders is achieved by introducing an embossed area (20.4, 20.4') on one side of the first contact partner (20, 20', 20", 60") that lies opposite the contact surface (20.2, 22.2', 24.2', 26.2', 20.2").

10. The contact arrangement as claimed in claim 4, wherein the thickness (LD) of the solder layer (30, 32', 34', 36', 30") is approximately 50 to 100 μm and the lateral spacing (A) is in the range from 100 to 400 μm.

11. The contact arrangement as claimed in claim 5, characterized in that the second solder layer (50, 50', 50") extends with the second contact partner (40, 40', 40") essentially parallel to the first solder layer (30, 32', 34', 36', 30") with the first contact partner (20, 20', 20", 60").

\* \* \* \* \*